(12) United States Patent
Roo et al.

(10) Patent No.: US 6,999,013 B1
(45) Date of Patent: *Feb. 14, 2006

(54) BUILT-IN REAL-TIME DIGITAL NON-LINEARITY MEASUREMENT DEVICE AND METHOD FOR ANALOG TO DIGITAL CONVERTERS

(75) Inventors: Pierte Roo, Mountain View, CA (US); Francis Campana, Milpitas, CA (US); William Lo, Cupertino, CA (US)

(73) Assignee: Marvell International LTD, Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 11/190,781

(22) Filed: Jul. 27, 2005

Related U.S. Application Data

(63) Continuation of application No. 10/795,907, filed on Mar. 8, 2004, now Pat. No. 6,943,712.

(60) Provisional application No. 60/517,722, filed on Nov. 6, 2003.

(51) Int. Cl.
*H03M 1/88* (2006.01)

(52) U.S. Cl. .................. 341/138; 341/120; 341/155

(58) Field of Classification Search .............. 341/120, 341/117, 155, 118, 119, 156, 126, 157, 116; 324/603; 702/78
See application file for complete search history.

(56) References Cited

U.S. PATENT DOCUMENTS

| | | | |
|---|---|---|---|
| 3,506,818 A | 4/1970 | Smith | |
| 3,544,736 A | 12/1970 | Bruwer | |
| 3,918,048 A | 11/1975 | Omura | |
| 4,318,086 A | 3/1982 | Peek et al. | |
| 4,992,716 A | 2/1991 | Ellis | |
| 5,721,546 A | 2/1998 | Tsutsumishita | |
| 6,362,769 B1 | 3/2002 | Hovin et al. | |
| 6,476,741 B1 | 11/2002 | Cherubal et al. | |
| 6,580,380 B1 | 6/2003 | Oh et al. | |
| 6,732,059 B1 | 5/2004 | Warburton et al. | |
| 6,774,829 B1 | 8/2004 | Nakada et al. | |

*Primary Examiner*—Jean Bruner Jeanglaude

(57) ABSTRACT

A nonlinearity detection system for an analog to digital converter (ADC) comprises a signal generator that generates a periodic signal that is output to the ADC and that comprises first and second intervals. The periodic signal monotonically increases during the first interval and monotonically decreases during the second interval. A differentiator module communicates with the ADC and that generates an output signal that is based on an output of the ADC and a delayed output of the ADC. A nonlinearity detection module detects slope discontinuities in the output signal of the differentiator module.

44 Claims, 9 Drawing Sheets

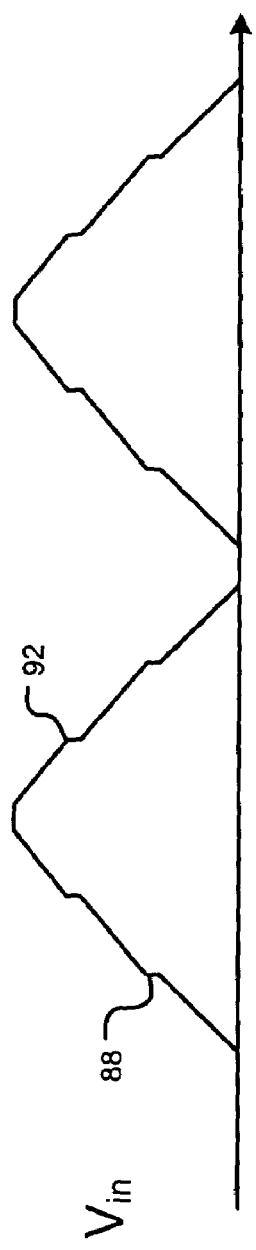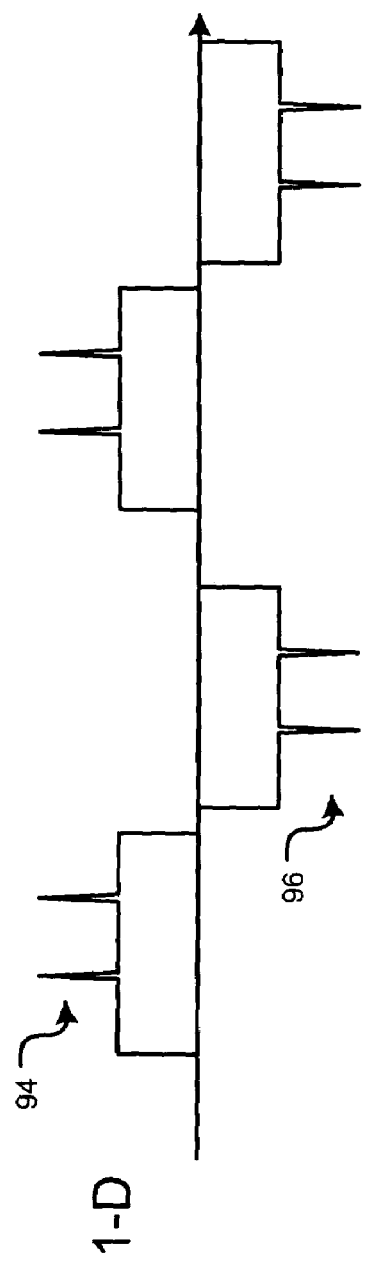
FIG. 6A
FIG. 6B

BUILT-IN REAL-TIME DIGITAL NON-LINEARITY MEASUREMENT DEVICE AND METHOD FOR ANALOG TO DIGITAL CONVERTERS

CROSS-REFERENCE TO RELATED APPLICATIONS

This application is a continuation of U.S. patent application Ser. No. 10/795,907 filed on Mar. 8, 2004 now U.S. Pat. No. 6,943,712 and claims the benefit of U.S. Provisional Application No. 60/517,722, filed on Nov. 6, 2003, which are hereby incorporated by reference in their entirety.

FIELD OF THE INVENTION

The present invention relates to analog to digital converters (ADCs), and more particularly to digital non-linearity measurement devices and methods for ADCs.

BACKGROUND OF THE INVENTION

Analog to digital converters (ADCs) convert an analog input signal to a digital output signal. ADCs are typically implemented on an integrated circuit (IC) or chip. The output of the ADCs typically contain nonlinearity errors that need to be characterized. The nonlinearity errors may occur when the ADC has a higher gain than expected during design, a lower gain than expected during design, multiple input voltages having the same output code, and/or in other situations.

In one conventional approach for characterizing the nonlinearity of the ADC, a tone is applied to an input of ADC. Tones are sinusoidal signals having a fixed frequency. Referring now to FIG. 1, a test signal generator 10 outputs the tone to an input of an ADC 14. An output of the ADC 14 is input to a nonlinearity detector 18. The nonlinearity detector 18 is typically an off-chip device that uses conventional algorithms that detect nonlinearities in the output of the ADC 14. Time consuming post-processing must be performed to characterize the nonlinearity of the ADC 14. The post-processing is repeated for different operating conditions such as but not limited to temperature, which increases the characterization time. In some circumstances, it may take on the order of days to properly characterize the ADC 14.

SUMMARY OF THE INVENTION

A nonlinearity detection system for an analog to digital converter (ADC) comprises a signal generator that generates a periodic signal that is output to the ADC and that comprises first and second intervals. The said periodic signal monotonically increases during the first interval and monotonically decreases during the second interval. A differentiator module communicates with the ADC and generates an output signal that is based on an output of the ADC and a delayed output of the ADC. A nonlinearity detection module detects slope discontinuities in the output signal of the differentiator module.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIGS. 6A and 6B are waveforms illustrating the output voltage of ADC and the output of the differentiator module, respectively, when the gain of the ADC is less than expected;

DETAILED DESCRIPTION OF THE PREFERRED EMBODIMENTS

Figure 1:
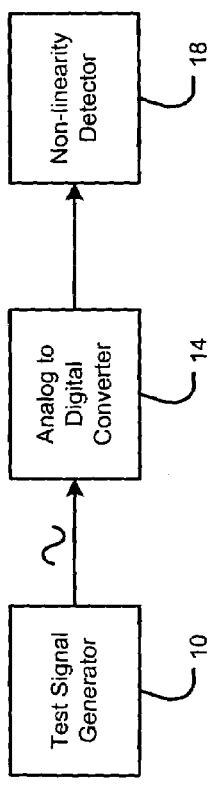
FIG. 1 is a functional block diagram of a nonlinearity detector according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

Figure 2A:
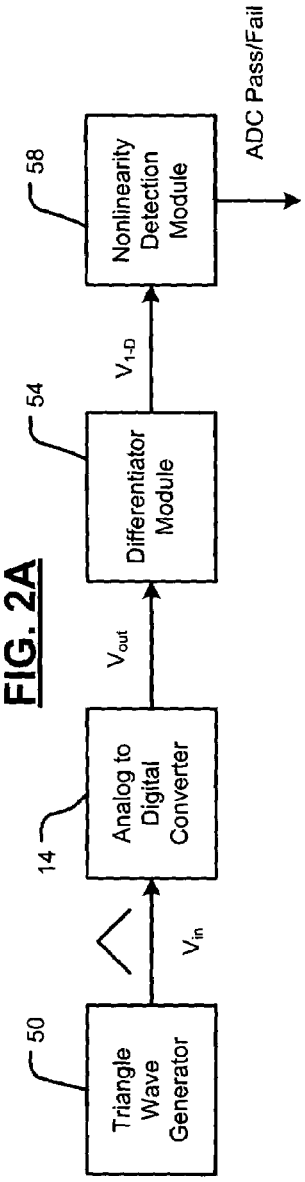
FIG. 2A is a functional block diagram of a nonlinearity detection module according to the present invention.
Figure 2B:
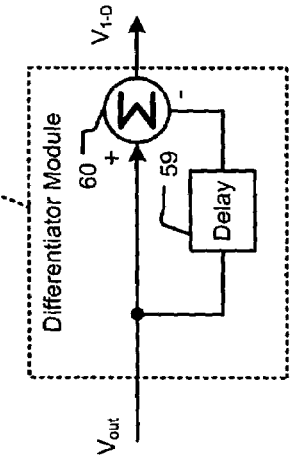
FIG. 2B is a functional block diagram of an exemplary differentiator module.

Referring now to FIGS. 2A and 2B, a triangle wave generator 50 outputs a triangular wave $V_{in}$ to an input of the ADC 14. The triangular wave $V_{in}$ has alternating regions with positive and negative slopes. The output signal $V_{out}$ of the ADC 14 is input to a differentiator module 54. The differentiator module 54 generates an output signal that is biased on $V_{out}$ and a delayed $V_{out}$. The output of the differentiator module 54 is input to a nonlinearity detection module 58, which generates a nonlinearity test pass/fail signal as will be described in further detail below.

In one implementation, the differentiator module 54 includes a delay element 59 and a summer 60. The delay element 59 outputs a delayed $V_{out}$ to an input of the summer 60. Another input of the summer 60 receives $V_{out}$. The summer 60 outputs $V_{1-D}$, which is $V_{out}$ minus a delayed $V_{out}$. The differentiator module 54 can be a discrete time differentiator, a discrete time filter, a finite impulse response (FIR) filter and/or any other suitable circuit.

Figure 2C:
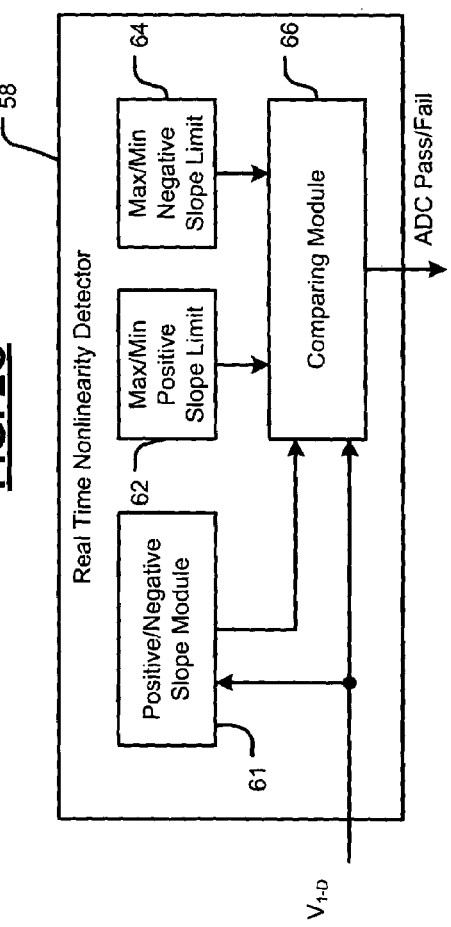
FIG. 2C is a functional block diagram of one exemplary implementation of the nonlinearity detection module according to the present invention.

Referring now to FIG. 2C, one exemplary implementation of the nonlinearity detection module 58 according to the present invention is shown. A positive/negative slope module 61 identifies positive and negative slope regions (after being differentiated) in the output of the differentiator module 54. A maximum/minimum positive slope limit module 62 sets maximum and minimum positive slope limits. A maximum/minimum negative slope limit module 64 sets maximum and minimum negative slope limits. A comparing module 66 compares the output of the differentiator module 54 to either the maximum/minimum positive slope limits when the positive slope region occurs or the maximum/minimum negative slope limits when the negative slope region occurs. If the slope values do not fall within the respective limits, the comparing module 66 of the nonlinearity detection module 58 generates a nonlinearity test fail signal. If the slope values fall within the respective limits, the comparing module 66 of the nonlinearity detection module 58 generates a nonlinearity test pass signal. As can be appreciated, the nonlinearity testing components can be implemented on-chip with the ADC 14.

Figure 3:
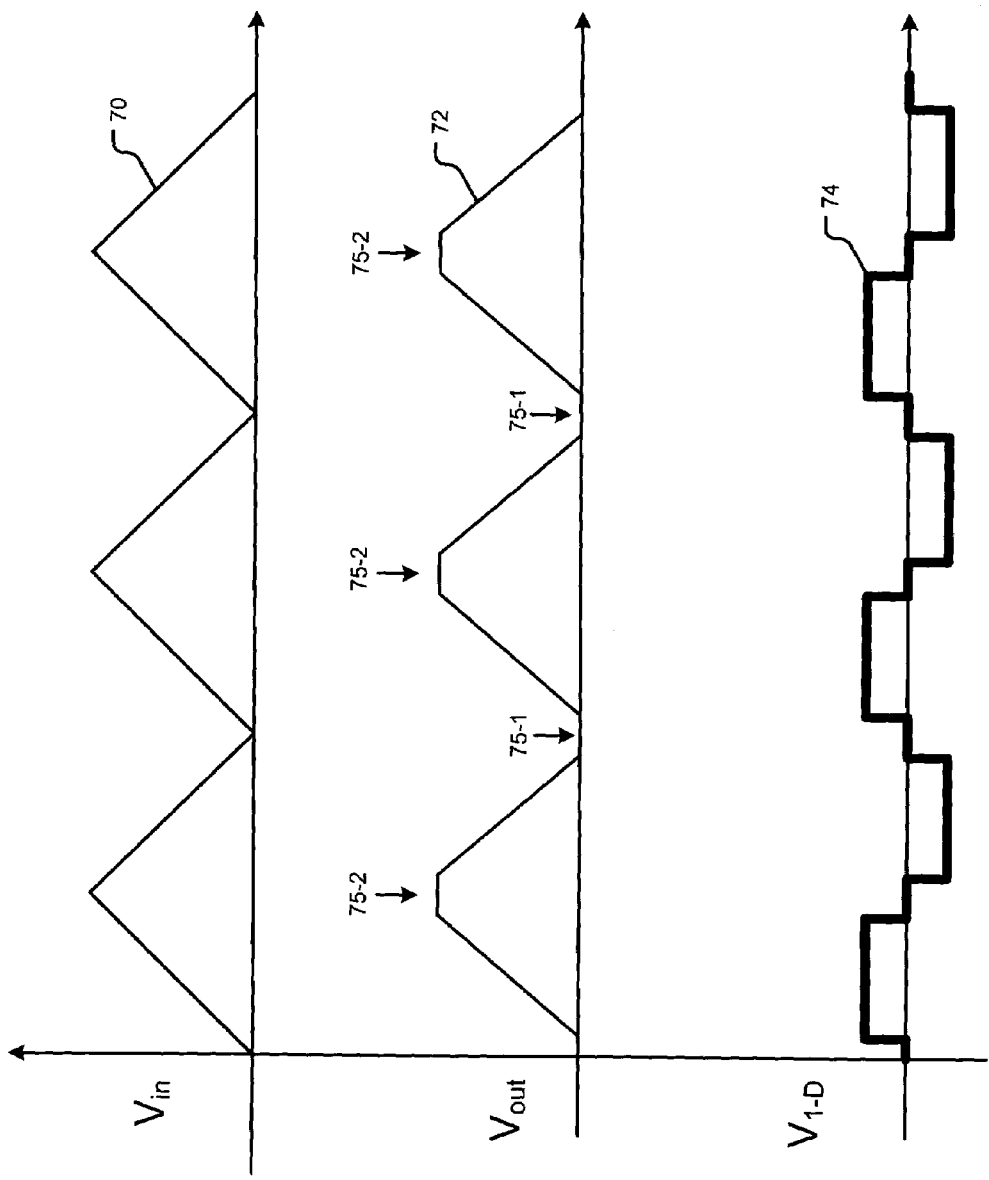
FIG. 3 are waveforms illustrating the input voltage, output voltage and differentiator module output according to the present invention.

Referring now to FIG. 3, the input signal $V_{in}$, the output signal $V_{out}$ and the output of the differentiator module $V_{1-D}$ are shown at 70, 72, and 74, respectively. In an ideal ADC, if a triangular waveform is input to an ADC, the output of the ADC is linear and has a constant slope between clipped regions 75-1 and 75-2 as shown. If the difference between the current ADC output and the previous ADC output ($V_{1-D}$) is plotted, the waveform has three major flat regions: maximum, 0, and minimum. The maximum and minimum values of $V_{1-D}$ correspond to the positive and negative slope regions of the rise and fall, respectively.

Figure 4:
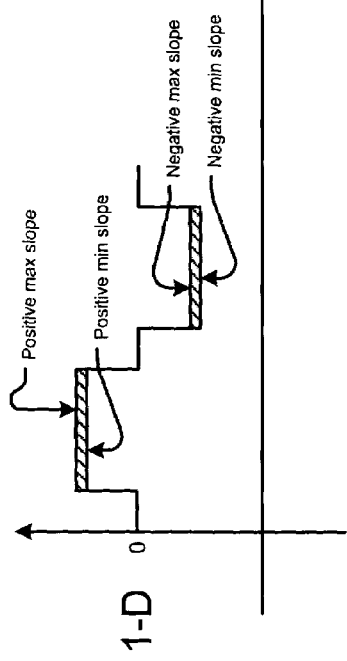
FIG. 4 is a waveform illustrating positive and negative maximum and minimum slope ranges of the differentiator module output.

Referring now to FIG. 4, since ADCs are neither ideal nor perfectly linear, the maximum and minimum regions of $V_{1-D}$ will have a narrow range of values rather than the single value that is shown in FIG. 3. In other words, the positive slope will fall between a positive maximum slope value and a positive minimum slope value. The negative slope will fall between a negative minimum slope value and a negative maximum slope value. These expected values are used to set the limits of the limit modules 62 and 64. The limit values that are selected will be based on the anticipated linearity of the ADC and the desired sensitivity of the nonlinearity test.

Figure 5A:
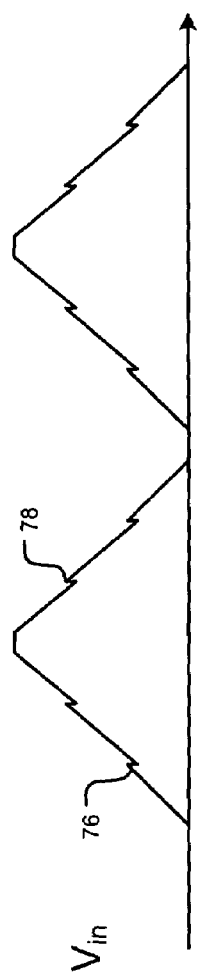
FIGS. 5A and 5B are waveforms illustrating the output voltage of ADC and the output of the differentiator module, respectively, when the gain of the ADC is greater than expected.
Figure 5B:
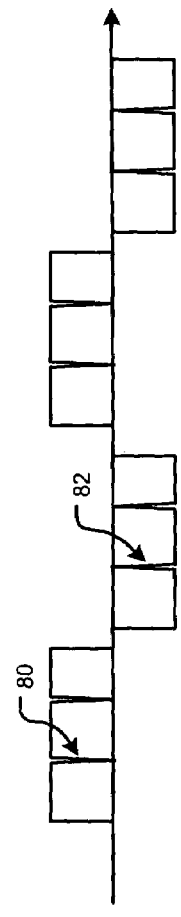

Referring now to FIGS. 5A and 5B, if the gain of the ADC 14 is greater than expected during design, the output voltage of the ADC 14 will include non-uniform positive and/or negative slope regions 76 and 78. These non-uniform positive and/or negative slope regions will cause discontinuities or spikes 80 and 82, respectively, in the output of the differentiator module 54. The discontinuities or spikes 80 and 82 represent nonlinearities in the output of the ADC 14.

Referring now to FIGS. 6A and 6B, if the gain of the ADC 14 is less than expected during design, the output voltage of the ADC 14 will include non-uniform positive and/or negative slope regions 88 and 92, respectively. These non-uniform positive and/or negative slope regions 88 and 92 will cause discontinuities or spikes 94 and 96, respectively in the output of the differentiator module 54. The discontinuities or spikes 94 and 96 fall outside of the respective positive and negative minimum and maximum limits and represent nonlinearities in the output of the ADC 14.

Figure 7A:
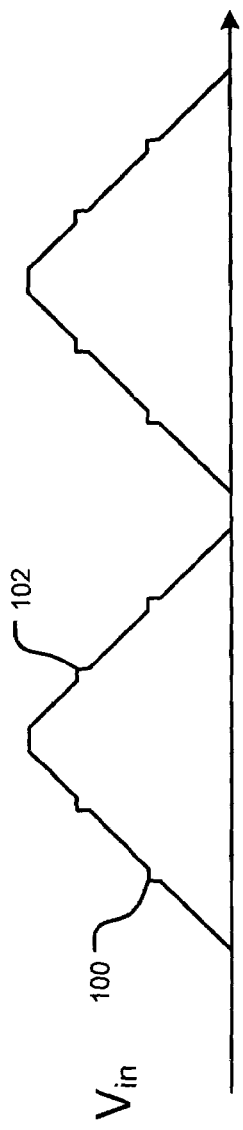
FIGS. 7A and 7B are waveforms illustrating the output voltage of ADC and the output of the differentiator module, respectively, when certain ranges of the ADC have the same output codes.
Figure 7B:
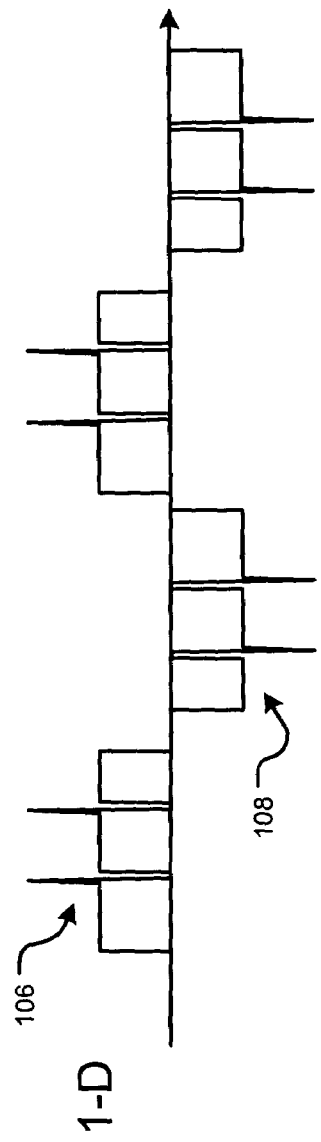

Referring now to FIGS. 7A and 7B, if the ADC 14 outputs the same output code for certain input voltage regions, the output voltage of the ADC 14 will include non-uniform positive and/or negative slope regions 100 and 102. These non-uniform positive and/or negative slope regions 100 and 102 will cause discontinuities or spikes 106 and 108, respectively, in the output of the differentiator module 54. The discontinuities or spikes 106 and 108 represent nonlinearities in the output of the ADC 14.

Figure 8:
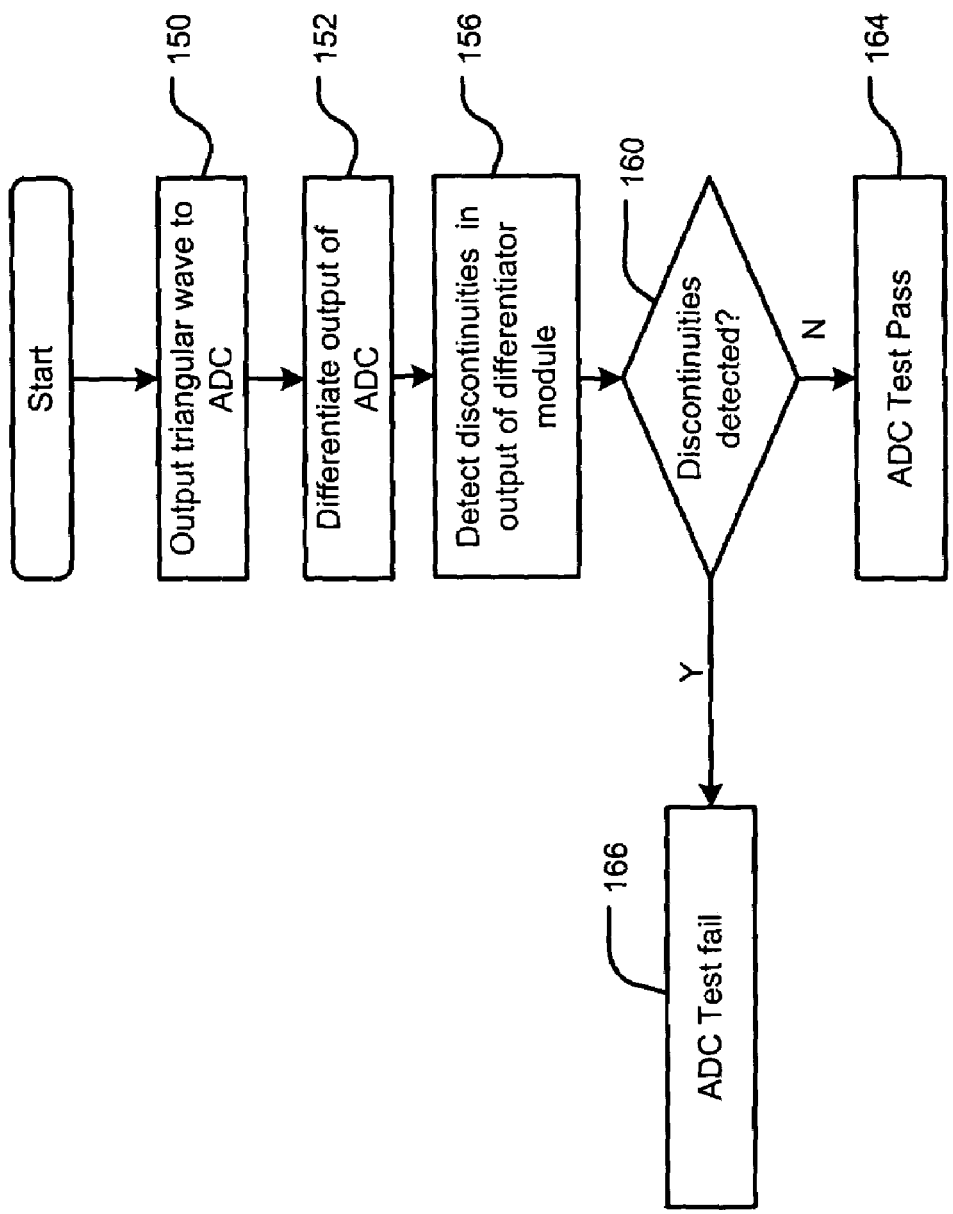
FIG. 8 is a flowchart illustrating steps for characterizing the nonlinearity of the ADC.

Referring now to FIG. 8, steps for operating the nonlinearity detector for the ADC 14 are shown. In step 150, a triangular wave is output to the ADC 14. In step 152, the output of the ADC 14 is differentiated. In step 156, the nonlinearity detection module 58 monitors discontinuities or spikes in the output of the differentiator module 54. In step 160, control determines whether the discontinuities or spikes are detected. If not, the ADC 14 passes the test in step 164. Otherwise, the ADC 14 fails the test in step 166.

Figure 9:
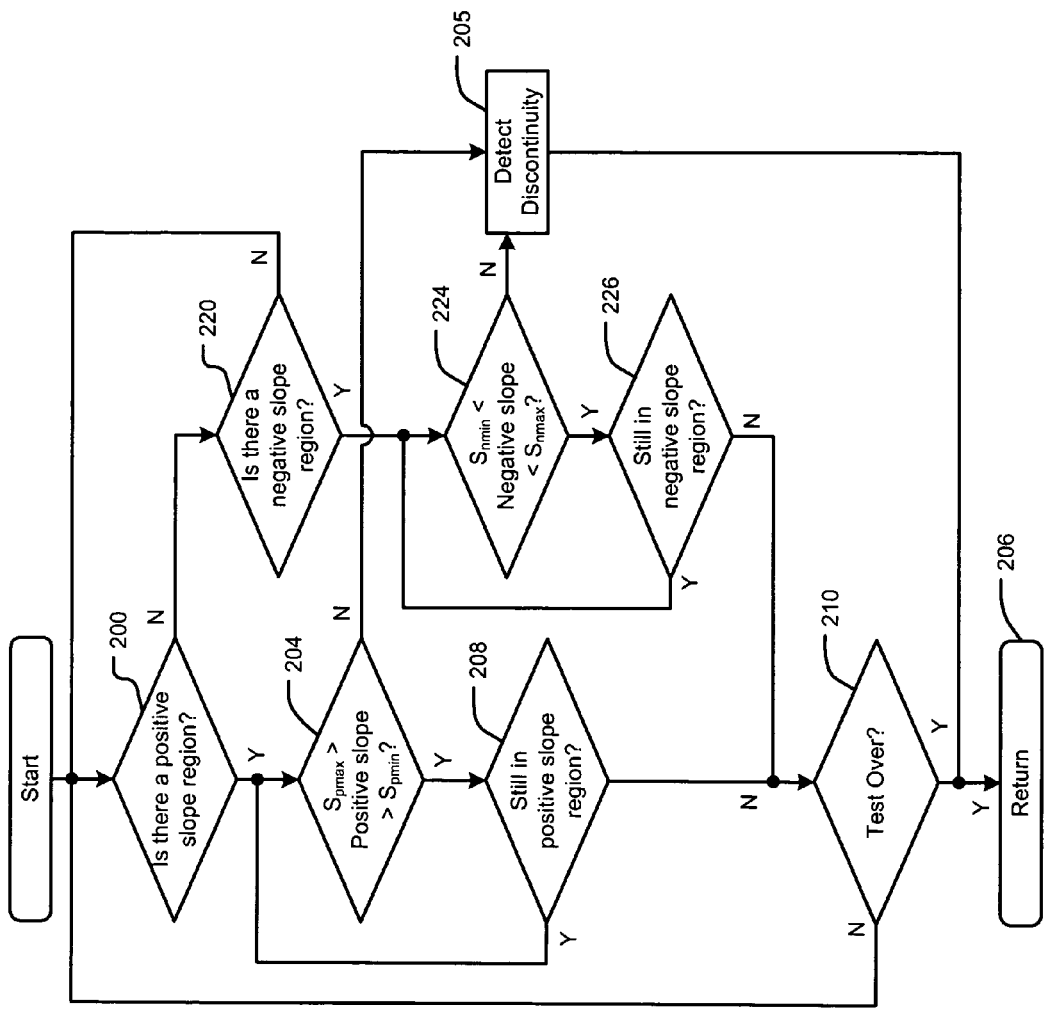
FIG. 9 is a flowchart illustrating steps for detecting discontinuities in the positive and negative slope regions of the ADC.

Referring now to FIG. 9, simplified steps for detecting discontinuities or spikes are shown. In step 200, control determines whether there is a positive slope region. If true, control determines whether the positive slope of the positive slope region is less than a positive maximum slope value and greater than a minimum positive slope value in step 204. If step 204 is false, control detects a discontinuity in step 205 and control returns in step 206. If step 204 is true, control determines whether the positive slope region ended in step 208.

If step 208 is true, control continues with step 204. If step 208 is false, control continues with step 210 and determines whether the test is over. If step 210 is true, control returns in step 206. If step 210 is false, control continues with step 200. If step 200 is false, control continues with step 220 and determines whether there is a negative slope region. If step 220 is false, control continues with step 200. If step 220 is true, control continues with step 224 and determines whether the negative slope is greater than a negative slope maximum value and less than a negative slope minimum value. If step 224 is true, control determines whether the output of the ADC is still in the negative slope region in step 226. If step 226 is true, control continues with step 224. If step 226 is false, control continues with step 210. If step 224 is false, control detects a discontinuity in step 205 and control returns in step 206.

Figure 10:
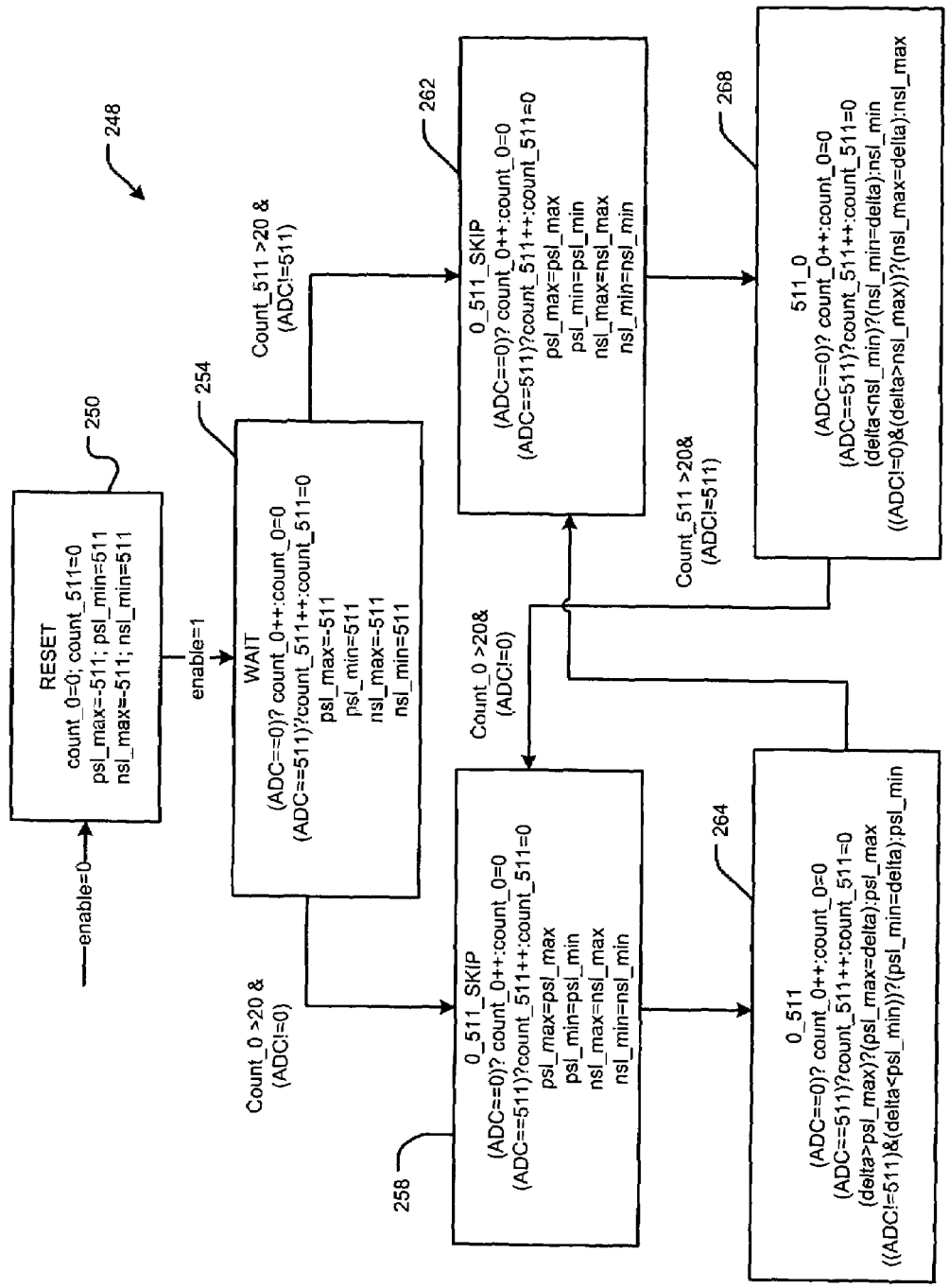
FIG. 10 is a state diagram for an exemplary implementation of the nonlinearity detection module.

Referring now to FIG. 10, a nonlinearity test state machine 248 for an exemplary 9-bit ADC is shown. As can be appreciated, while FIG. 10 describes a 9-bit ADC, the ADC can be any n-bit ADC, where n is an integer. Variables used therein are defined as follows: count_0 is a count of consecutive lowest ADC code, usually code 0. Count_511 is a count of consecutive highest ADC code. ADC code 511 represents the highest code output (when 9 bit ADCs are used). As can be appreciated, ADCs with other bit lengths will have codes will have a code of ($2^n-1$). psl_max is a maximum slope for positive slope regions. psl_min is a minimum slope for positive slope regions. nsl_max is a maximum slope for negative slope regions. nsl_min is a minimum slope for negative slope regions.

Figure 11:
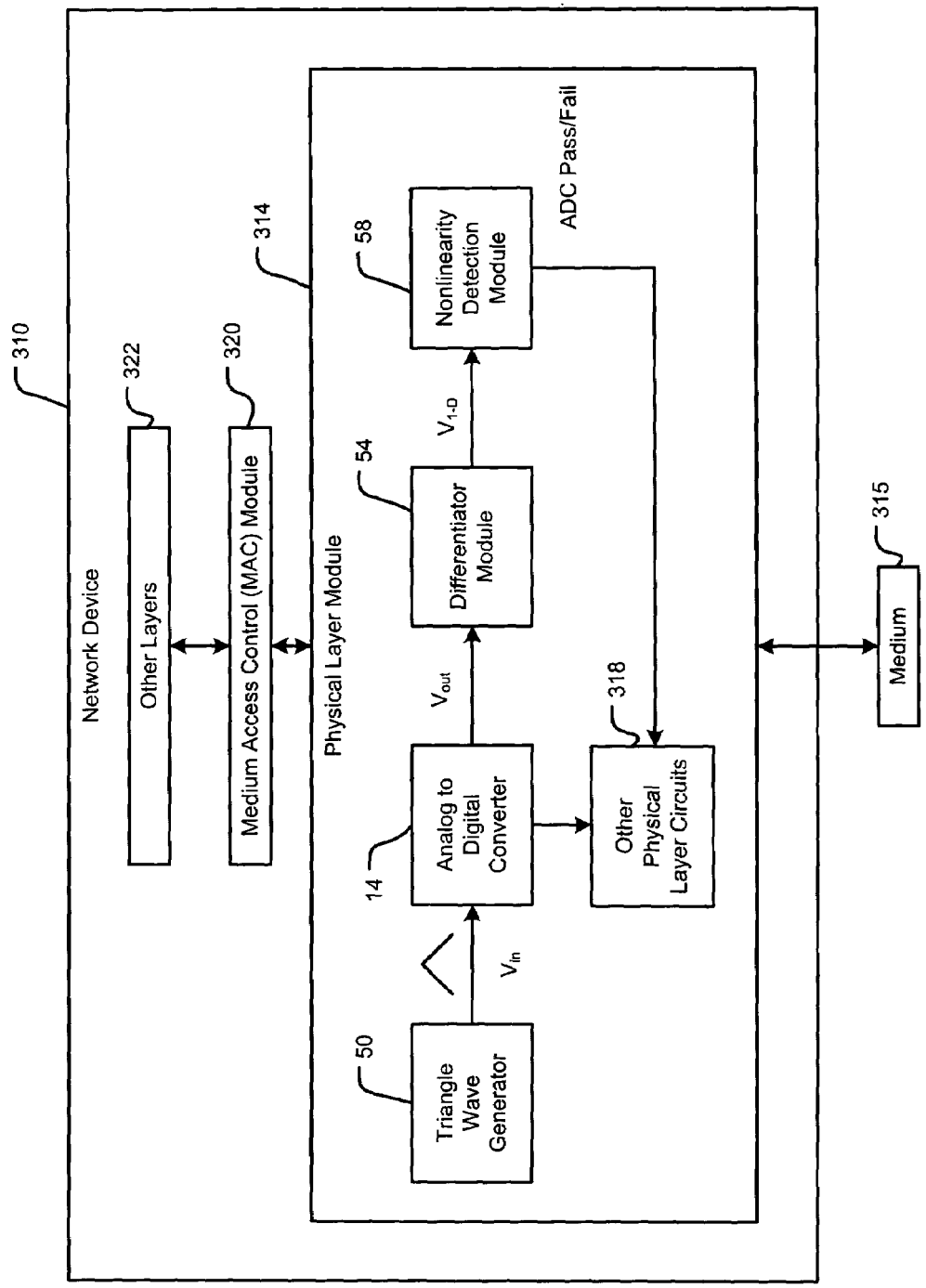
FIG. 11 is a functional block diagram of a network device that includes a physical layer module with nonlinearity detection module.

When an enable signal is equal to zero, the state machine 248 goes to a RESET state 250. In the RESET state 250, variables are initialized as shown. When the enable signal is asserted, the state machine 248 moves to a WAIT state 254. In the WAIT state 254, it aligns to either the clip waveform region where the ADC code equals 0 (clip region 0) or the clip waveform region where the ADC code equals 511 (clip region 511). Variables count_0 and count_511 count the number of consecutive ADC codes equal to 0 or 511, respectively. When count_0 or count_511 reaches a count threshold, the waveform is either in clip region 0 or clip region 511. When a different ADC code is encountered after the count threshold has been reached, the state machine 248 moves to either 0_511_skip state 258 or 511_0_skip state 262. In either of the states 258 or 262, the slope based on this ADC 14 is not included in the calculation of the maximum and minimum slopes. In the next cycle, the state machine 248 moves to either 0_511 state 264 or 511_0 state 268, respectively, where the maximum and minimum slopes are calculated based on the following equations:

if((state == 0_511) & ~((ADC==0) & (prev_ADC==0)) & ~((ADC==511) & (prev_ADC==511)))
  begin
  (delta > psl_max) ? (psl_max = delta) : psl_max
  (ADC!=511) & (delta < psl_min)(psl_min=delta) : psl_min
  end
if((state==511_0) & ~((ADC==0) & (prev_ADC==0)) & ~((ADC==511) & (prev_ADC==511)))
  (delta < nsl_min) ? (nsl_min = delta) : nsl_min
  (ADC!=0) & (delta > nsl_max) (nsl_max=delta) : nsl_max
  end Referring now to FIG. 11, a network device 310 is shown that includes a physical layer module 314, which includes the triangle wave generator 50, the ADC 14, the differentiator module 54, and the non-linearity detection module 58. The physical layer module 314 communicates with a medium 315. In one embodiment, the medium 315 includes one or more twisted pairs of wire, although other media may be used. The output of the non-linearity detection module 58 may be sent to one or more other physical layer circuits 318, to a medium access control (MAC) module 320 and/or other layers 322.

The network device 310 can be an Ethernet network device that is wireless or wired. In one embodiment, the Ethernet network device is a wired network that is compliant with 1000BaseT. Still other implementations will be apparent to skilled artisans.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A nonlinearity detection system for an analog to digital converter (ADC), comprising:
   a signal generator that generates a periodic signal that is output to the ADC and that comprises first and second intervals, wherein said periodic signal monotonically increases during said first interval and monotonically decreases during said second interval;
   a differentiator module that communicates with the ADC and that generates an output signal that is based on an output of the ADC and a delayed output of the ADC; and
   a nonlinearity detection module that detects slope discontinuities in said output signal of said differentiator module.

2. The nonlinearity detection system of claim 1 wherein said differentiator module includes a discrete-time differentiator.

3. The nonlinearity detection system of claim 1 wherein said differentiator module includes a discrete time filter.

4. The nonlinearity detection system of claim 3 wherein said discrete time filter includes a finite impulse response (FIR) filter.

5. An integrated circuit comprising the nonlinearity detection system of claim 1 and further comprising said ADC.

6. The nonlinearity detection system of claim 1 wherein said nonlinearity detection module determines maximum and minimum positive and negative slope limits for positive and negative slope regions, respectively, of said output signal of said differentiator module.

7. The nonlinearity detection system of claim 6 wherein said nonlinearity detection module compares slope values in said positive slope region to said maximum and minimum positive slope limits to detect said slope discontinuities.

8. The nonlinearity detection system of claim 7 wherein said nonlinearity detector generates a nonlinearity test fail signal when said slope values in said positive slope region are at least one of greater than said maximum positive slope limit and less than said minimum positive slope limit during said positive slope regions.

9. The nonlinearity detection system of claim 6 wherein said nonlinearity detection module compares slope values in said negative slope regions to said maximum and minimum negative slope limits to detect said slope discontinuities.

10. The nonlinearity detection system of claim 9 wherein said nonlinearity detection module generates a nonlinearity test fail signal when said slope values in said negative slope regions are at least one of greater than said maximum negative slope limit and less than said minimum negative slope limit during said negative slope regions.

11. The nonlinearity detection system of claim 1 wherein said nonlinearity detection module comprises:
   a slope region identifying module that identifies positive and negative slope regions in said output signal of said differentiator module;
   a positive slope limit module that determines maximum and minimum limits for said positive slope region;
   a negative slope limit module that determines maximum and minimum limits for said negative slope region; and
   a comparing module that receives said output signal of said differentiator module, that compares said output signal of said differentiator module to one of said maximum and minimum limits for said positive slope region and said maximum and minimum limits for said negative slope region, and that generates a nonlinearity test signal based on said comparison.

12. The nonlinearity detection system of claim 7 wherein said nonlinearity detector generates a nonlinearity test pass signal when said slope values in said positive slope region are at least one of less than said maximum positive slope limit and greater than said minimum positive slope limit during said positive slope regions.

13. The nonlinearity detection system of claim 9 wherein said nonlinearity detection module generates a nonlinearity test pass signal when said slope values in said negative slope regions are at least one of less than said maximum negative slope limit and greater than said minimum negative slope limit during said negative slope regions.

14. An integrated circuit comprising the nonlinearity detection system of claim 1.

15. An Ethernet physical layer device comprising the nonlinearity detection system of claim 1.

16. The Ethernet physical layer device of claim 15 wherein said Ethernet physical layer device is compatible with 1000BaseT.

17. A nonlinearity detecting system for an analog to digital converter (ADC), comprising:
    signal generating means for generating a periodic signal that is output to the ADC and that comprises first and second intervals, wherein said periodic signal monotonically increases during said first interval and monotonically decreases during said second interval;
    differentiating means that communicates with the ADC for generating an output signal that is based on an output of the ADC and a delayed output of the ADC; and
    nonlinearity detecting means for detecting slope discontinuities in said output signal of said differentiating means.

18. The nonlinearity detecting system of claim 17 wherein said differentiating means includes a discrete-time differentiator.

19. The nonlinearity detecting system of claim 17 wherein said differentiating means includes a discrete time filter.

20. The nonlinearity detecting system of claim 19 wherein said discrete time filter includes a finite impulse response (FIR) filter.

21. An integrated circuit comprising the nonlinearity detecting system of claim 17 and further comprising said ADC.

22. The nonlinearity detecting system of claim 17 wherein said nonlinearity detecting means determines maximum and minimum positive and negative slope limits for positive and negative slope regions, respectively, of said output signal of said differentiating means.

23. The nonlinearity detecting system of claim 22 wherein said nonlinearity detecting means compares slope values in said positive slope region to said maximum and minimum positive slope limits to detect said slope discontinuities.

24. The nonlinearity detecting system of claim 23 wherein said nonlinearity detecting means generates a nonlinearity test fail signal when said slope values in said positive slope region are at least one of greater than said maximum positive slope limit and less than said minimum positive slope limit during said positive slope regions.

25. The nonlinearity detecting system of claim 22 wherein said nonlinearity detecting means compares slope values in said negative slope regions to said maximum and minimum negative slope limits to detect said slope discontinuities.

26. The nonlinearity detecting system of claim 25 wherein said nonlinearity detecting means generates a nonlinearity test fail signal when said slope values in said negative slope regions are at least one of greater than said maximum negative slope limit and less than said minimum negative slope limit during said negative slope regions.

27. The nonlinearity detecting system of claim 17 wherein said nonlinearity detecting means comprises:
    slope region identifying means for identifying positive and negative slope regions in said output signal of said differentiating means;
    positive slope limit means for determining maximum and minimum limits for said positive slope region;
    negative slope limit means for determining maximum and minimum limits for said negative slope region; and
    comparing means that receives said output signal of said differentiating means for comparing said output signal of said differentiating means to one of said maximum and minimum limits for said positive slope region and said maximum and minimum limits for said negative slope region, and for generating a nonlinearity test signal based on said comparison.

28. The nonlinearity detecting system of claim 23 wherein said nonlinearity detecting means generates a nonlinearity test pass signal when said slope values in said positive slope region are at least one of less than said maximum positive slope limit and greater than said minimum positive slope limit during said positive slope regions.

29. The nonlinearity detecting system of claim 25 wherein said nonlinearity detecting means generates a nonlinearity test pass signal when said slope values in said negative slope regions are at least one of less than said maximum negative slope limit and greater than said minimum negative slope limit during said negative slope regions.

30. An integrated circuit comprising the nonlinearity detecting system of claim 17.

31. An Ethernet physical layer device comprising the nonlinearity detecting system of claim 17.

32. The Ethernet physical layer device of claim 31 wherein said Ehternet physical layer device is compatible with 1000BaseT.

33. A method for detecting nonlinearity in an analog to digital converter (ADC), comprising:
    generating a periodic signal that is output to the ADC and that comprises first and second intervals, wherein said periodic signal monotonically increases during said first interval and monotonically decreases during said second interval;
    generating an output signal that is based on an output of the ADC and a delayed output of the ADC; and
    detecting slope discontinuities in said output signal.

34. The method of claim 33 wherein said step of generating said output signal includes performing discrete-time differentiation.

35. The method of claim 33 wherein said step of generating said output signal includes performing discrete time filtering.

36. The method of claim 35 wherein said discrete time filtering includes finite impulse response (FIR) filtering.

37. The method of claim 33 further comprising determining maximum and minimum positive and negative slope limits for positive and negative slope regions, respectively, of said output signal.

38. The method of claim 37 further comprising comparing slope values in said positive slope region to said maximum and minimum positive slope limits to detect said slope discontinuities.

39. The method of claim 38 further comprising generating a nonlinearity test fail signal when said slope values in said positive slope region are at least one of greater than said maximum positive slope limit and less than said minimum positive slope limit during said positive slope regions.

40. The method of claim 37 further comprising comparing slope values in said negative slope regions to said maximum and minimum negative slope limits to detect said slope discontinuities.

41. The method of claim 40 further comprising generating a nonlinearity test fail signal when said slope values in said negative slope regions are at least one of greater than said maximum negative slope limit and less than said minimum negative slope limit during said negative slope regions.

42. The method of claim 33 further comprising:
    identifying positive and negative slope regions in said output signal;
    determining maximum and minimum limits for said positive slope region;

determining maximum and minimum limits for said negative slope region;
comparing said output signal to one of said maximum and minimum limits for said positive slope region and said maximum and minimum limits for said negative slope region; and
generating a nonlinearity test signal based on said comparison.

43. The method of claim 40 further comprising generating a nonlinearity test pass signal when said slope values in said positive slope region are at least one of less than said maximum positive slope limit and greater than said minimum positive slope limit during said positive slope regions.

44. The method of claim 40 further comprising generating a nonlinearity test pass signal when said slope values in said negative slope regions are at least one of less than said maximum negative slope limit and greater than said minimum negative slope limit during said negative slope regions.

* * * * *

UNITED STATES PATENT AND TRADEMARK OFFICE
CERTIFICATE OF CORRECTION

PATENT NO. : 6,999,013 B1
APPLICATION NO. : 11/190781
DATED : February 14, 2006
INVENTOR(S) : Pierte Roo et al.

Page 1 of 1

It is certified that error appears in the above-identified patent and that said Letters Patent is hereby corrected as shown below:

Column 4, Line 56:   Delete "will have codes" after "lengths"

Signed and Sealed this

Fifteenth Day of August, 2006

JON W. DUDAS
*Director of the United States Patent and Trademark Office*